(12) United States Patent
Kim et al.

(10) Patent No.: US 8,081,037 B2
(45) Date of Patent: Dec. 20, 2011

(54) RING OSCILLATOR USING ANALOG PARALLELISM

(75) Inventors: Jonghae Kim, San Diego, CA (US); Lew G. Chua-Eoan, Carlsbad, CA (US); Matthew Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/136,952

(22) Filed: Jun. 11, 2008

(65) Prior Publication Data
US 2009/0309667 A1   Dec. 17, 2009

(51) Int. Cl.
*H03K 3/03* (2006.01)
(52) U.S. Cl. ............... 331/57; 331/46; 331/49; 331/50; 331/60; 331/74; 331/187
(58) Field of Classification Search ............ 331/46, 331/49, 50, 57, 60, 74, 187
See application file for complete search history.

(56) References Cited

U.S. PATENT DOCUMENTS

| | | | | |
|---|---|---|---|---|
| 5,592,126 A | * | 1/1997 | Boudewijns et al. | 331/45 |
| 5,877,641 A | * | 3/1999 | Ziegler et al. | 327/156 |
| 6,310,928 B1 | | 10/2001 | Yunome | |
| 6,683,504 B1 | | 1/2004 | Abernathy | |
| 6,771,134 B2 | * | 8/2004 | Wong et al. | 331/57 |
| 7,449,961 B2 | | 11/2008 | Sai et al. | |
| 2004/0264233 A1 | * | 12/2004 | Fukushima et al. | 365/145 |
| 2005/0036578 A1 | * | 2/2005 | Heidel et al. | 375/371 |
| 2006/0069706 A1 | * | 3/2006 | Lazich et al. | 708/251 |
| 2008/0120065 A1 | * | 5/2008 | Joshi et al. | 702/182 |

OTHER PUBLICATIONS

International Search Report—PCT/US09/044165, International Search Authority—European Patent Office—Aug. 13, 2009.
Written Opinion—PCT/US09/044165, International Search Authority—European Patent Office—Aug. 13, 2009.

* cited by examiner

*Primary Examiner* — Joseph Chang
*Assistant Examiner* — Richard Tan
(74) *Attorney, Agent, or Firm* — Sam Talpalatsky; Michelle Gallardo; Jonathan T. Velasco (57) ABSTRACT

An apparatus including a ring oscillator and related methods are disclosed. The ring oscillator includes at least two ring loops. A first ring loop includes a plurality of series coupled delay cells. At least one additional ring loop includes a plurality of series coupled delay cells. The at least one additional ring loop is coupled to the first ring loop by one or more common delay cells shared between the first ring loop and the at least one additional ring loops.

29 Claims, 7 Drawing Sheets

RING OSCILLATOR USING ANALOG PARALLELISM

FIELD OF DISCLOSURE

The present disclosure is directed to oscillators, and more particularly, to ring oscillators with improved phase noise and jitter performance.

BACKGROUND

Voltage controlled oscillators (VCOs) are used in phase locked loops (PLLs) to generate digital or analog clock signals for microprocessors, wireless communications systems, etc.

One type of VCO commonly used is an LC-tank based VCO. LC-tank VCOs generate clock signals with a high quality factor (Q-factor, or simply 'Q'), but have several undesirable design constraints and are relatively expensive to implement in integrated circuits (ICs). Furthermore, LC-tank VCOs have a relatively narrow frequency tuning-range, which leads to a low process variation tolerance during manufacturing and negatively impacts product yield.

Another type of VCO commonly used is a ring based oscillator. A ring oscillator is a device composed of an odd number of inverting delay cells (e.g., inverters, NAND gates, etc.) whose output signal oscillates between two voltage levels. The delay cells are coupled to each other in series where the output of the last delay cell is fed back into the input of the first delay cell to form a chain.

Figure 1:
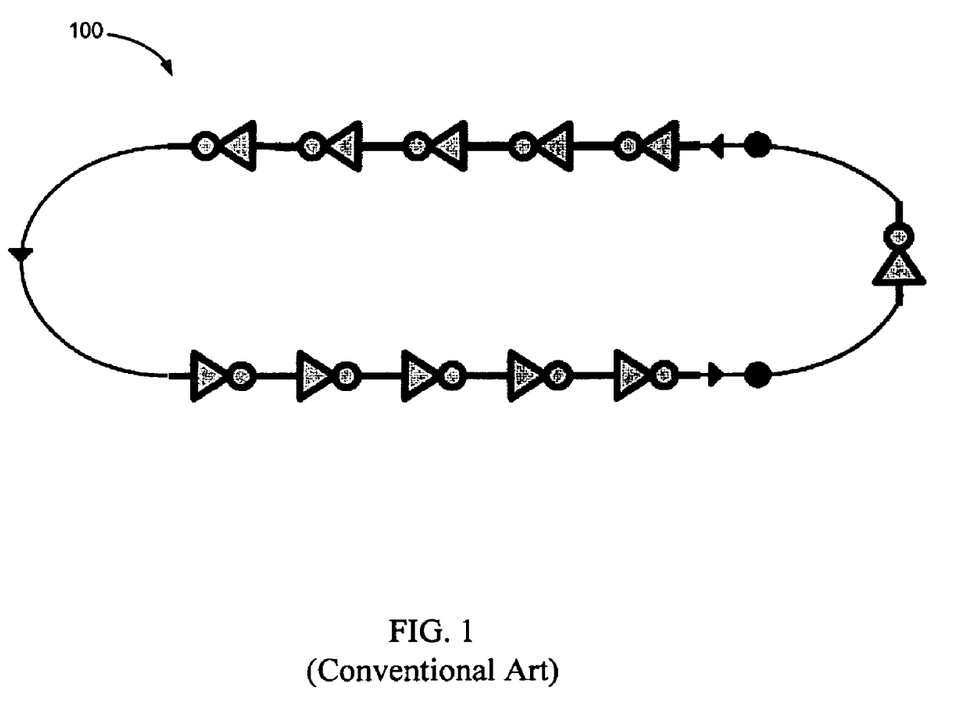
FIG. 1 illustrates an example conventional ring oscillator.

FIG. 1 illustrates an example of a conventional ring oscillator. As shown, a conventional ring oscillator 100 can be formed of a plurality of inverters coupled together in series. Because a single inverter computes the logical NOT of its input, the last output of an odd numbered chain of inverters is the logical NOT of the first input. This final output is asserted a finite amount of time after the first input is asserted, and thus, the feedback of this last output to the first input causes oscillation.

Ring oscillators are capable of generating a wider frequency tuning-range than are LC-tank VCOs, which can help overcome process variations experienced during manufacturing, and therefore improve product yield. However, conventional ring oscillators suffer from relatively poor signal quality (as measured by, e.g., phase noise or jitter) due to a lower Q-factor as compared to LC-tank VCOs. This can be a significant drawback of ring oscillators for certain applications.

SUMMARY

Exemplary embodiments of the invention are directed to systems and methods for providing an oscillating signal using a ring oscillator.

One embodiment of the invention is directed to an apparatus including a ring oscillator. The ring oscillator includes at least two ring loops. A first ring loop includes a plurality of series coupled delay cells. At least one additional ring loop includes a plurality of series coupled delay cells. The at least one additional ring loop is coupled to the first ring loop by one or more common delay cells shared between the first ring loop and the at least one additional ring loops.

Another embodiment of the invention is directed to a method of providing an oscillating signal using a ring oscillator. The method includes propagating a first signal through a first plurality of series coupled delay cells forming a first ring loop of the ring oscillator. A second signal is propagated through at least one additional plurality of series coupled delay cells forming at least one additional ring loop of the ring oscillator. The first and second signals are coupled together to provide an oscillating output signal using one or more common delay cells shared between the first ring loop and the at least one additional ring loops.

Another embodiment of the invention is directed to an apparatus including a ring oscillator. The ring oscillator includes at least two ring loops. A first ring loop includes a plurality of series coupled means for delaying and inverting an input. At least one additional ring loop includes a plurality of series coupled means for delaying and inverting an input. The at least one additional ring loop is coupled to the first ring loop by one or more common means for delaying and inverting an input shared between the first ring loop and the at least one additional ring loops.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. In addition, the terms "jitter" and "phase noise" are used interchangeably herein in so far as they describe the undesired variation of one or more characteristics of a periodic signal.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As discussed in the background, ring oscillators are capable of generating a wider frequency tuning-range than are LC-tank VCOs, which can help overcome process variations experienced during manufacturing, and therefore improve product yield. However, conventional ring oscillators, such as ring oscillator 100 of FIG. 1, suffer from relatively poor signal quality. Accordingly, embodiments of the invention provide ring oscillator designs with improved phase noise and jitter performance by augmenting the conventional, single-loop ring oscillator with one or more auxiliary loops sharing one or more common delay cells with the main loop (referred to herein as analog parallelism). Embodiments of the invention also provide methods of operating multi-loop ring oscillators under various performance and/or power consumption requirements.

Figure 2:
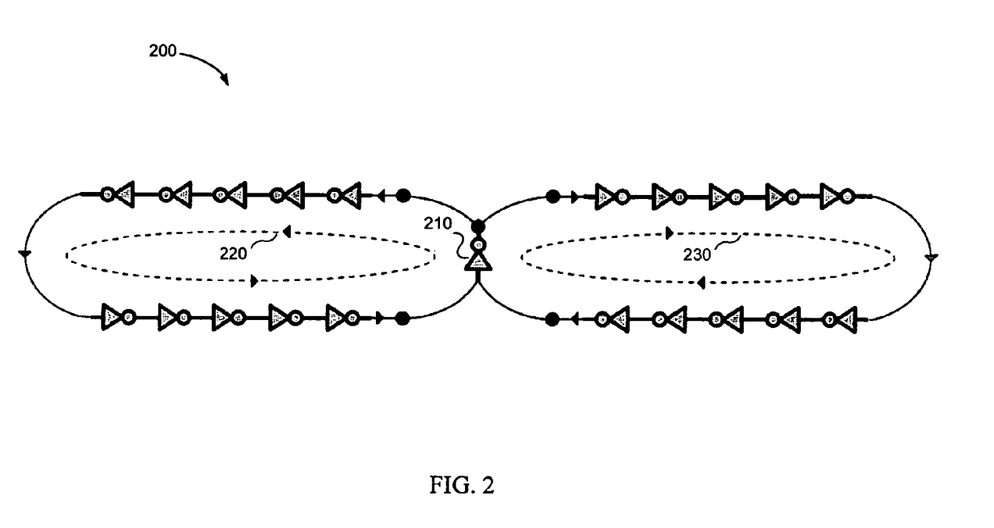
FIG. 2 illustrates a two-loop ring oscillator according.

FIG. 2 illustrates a two-loop ring oscillator according to embodiments of the invention. As shown, ring oscillator 200 includes a main loop 220 and an auxiliary loop 230, coupled together by sharing a common delay cell 210. For simplicity, the delay cells of FIG. 2 are illustrated as inverters. It will be appreciated, however, that the delay cells may be any element capable of providing an inverted, time-delayed output of an input signal, such as inverters, NAND gates, etc. In this design, an oscillating output signal can be tapped from the output of the common delay cell 210 (i.e., output stage).

By sharing common delay element 210 between the main loop 220 and auxiliary loop 230, ring oscillator 200 provides additional feedback current to its output stage as compared to conventional designs. Accordingly, signal amplitude within the output stage can be increased without increasing the noise in the system. This improves jitter performance and increases the oscillator performance.

FIGS. 3A through 3E illustrate example two-loop ring oscillators with a varying number of common delay elements shared between a main loop and an auxiliary loop according to various embodiments of the invention.

In the embodiment of FIG. 2, only a single common delay element 210 is shared between main loop 220 and auxiliary loop 230. However, as shown in FIGS. 3B through 3E, more than one common delay element can be shared between a main loop and an auxiliary loop according to various embodiments of the invention.

Figure 3A:
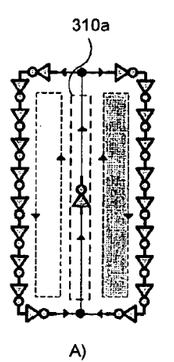
FIGS. 3A through 3E illustrate example two-loop ring oscillators with a varying number of common delay elements shared between a main loop and an auxiliary loop.
Figure 3B:
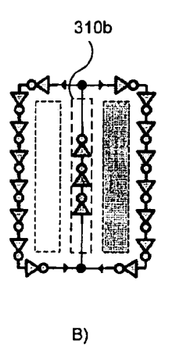
Figure 3C:
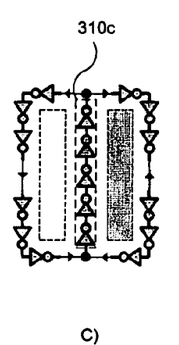
Figure 3D:
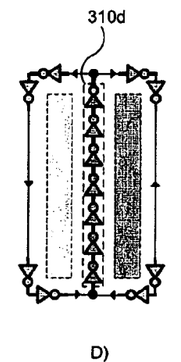
Figure 3E:
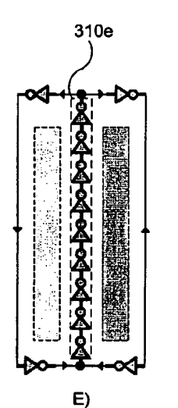

In particular, FIG. 3A illustrates an embodiment in which one common delay element 310*a* is shared between a main loop and an auxiliary loop. FIG. 3A corresponds to the design of FIG. 2 and is shown again for comparison. FIG. 3B illustrates an embodiment in which three common delay elements 310*b* are shared between a main loop and an auxiliary loop. FIG. 3C illustrates an embodiment in which five common delay elements 310*c* are shared between a main loop and an auxiliary loop. FIG. 3D illustrates an embodiment in which seven common delay elements 310*d* are shared between a main loop and an auxiliary loop. FIG. 3E illustrates an embodiment in which nine common delay elements 310*e* are shared between a main loop and an auxiliary loop.

Sharing additional delay cells between the main and auxiliary loops reduces the total number of devices, which reduces power consumption. Furthermore, reducing the total number of devices saves area on the chip, and may potentially reduce costs. However, sharing additional delay cells also reduces performance in terms of signal quality improvements. Thus, each design of FIGS. 3A through 3E represents a different trade-off between performance and power consumption. Accordingly, the designs of FIGS. 3A through 3E are suitable for a wide range of applications.

It will be appreciated, however, that the designs of FIGS. 3A through 3E are provided for illustration purposes only, and that the number of delay cells shared between the main and auxiliary loops is not limited to the number shown. For example, although an odd number of common delay cells are illustrated, an even number of common delay cells can also be used provided that the number of delay cells in each loop is an odd number. As discussed in the background, an odd number of delay cells are used to promote oscillation.

Figure 4:
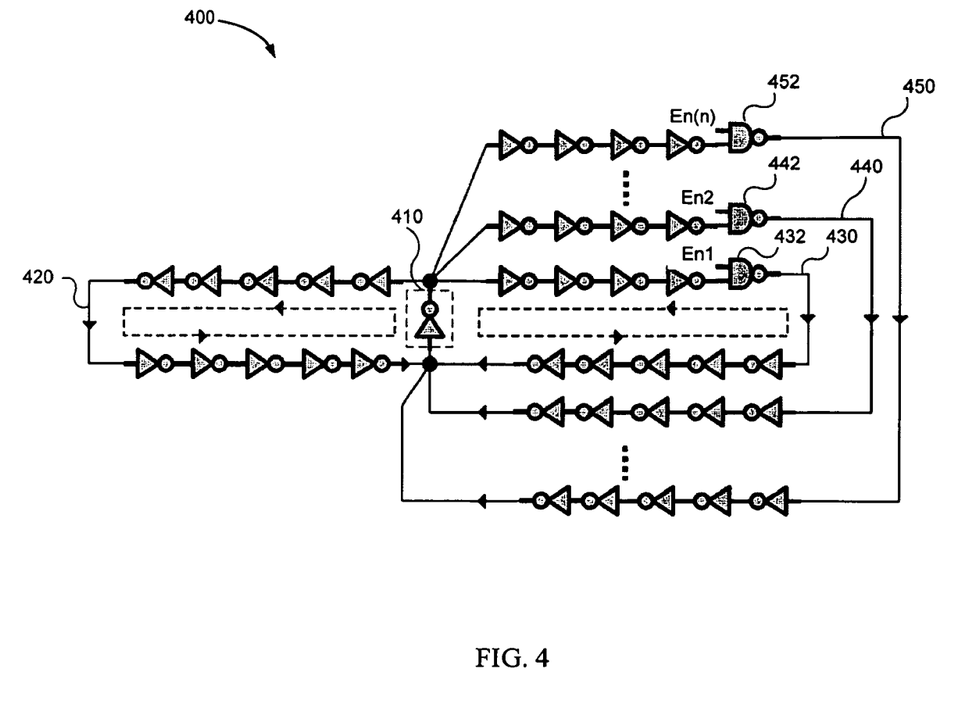
FIG. 4 illustrates a ring oscillator having multiple auxiliary loops.

FIG. 4 illustrates a ring oscillator having multiple auxiliary loops according to embodiments of the invention.

In the embodiments of FIGS. 2 and 3A through 3E, only one auxiliary loop is illustrated. However, as shown in FIG. 4, more than one auxiliary loop can be used in conjunction with a main loop according to various embodiments of the invention to further improve jitter performance.

As shown, ring oscillator 400 includes a main loop 420, a first auxiliary loop 430, a second auxiliary loop 440, and up to an nth auxiliary loop 450. Each auxiliary loop 430-450 is coupled to the main loop 420 by sharing one or more common delay cells 410. For clarity, only a single common delay cell 410 is illustrated in FIG. 4. It will be appreciated, however, that ring oscillator 400 can be implemented with any number of common delay cells, as described in more detail above with reference to FIGS. 3B through 3E.

As is further illustrated in FIG. 4, each auxiliary loop 430-450 includes an enable cell 432, 442, and 452, respectively. The enable cells 432, 442, and 452 are configured to activate or deactivate their corresponding ring loop based on a received control signal. In the embodiment of FIG. 4, enable cells 432, 442, and 452 are illustrated as NAND gates coupled in series with the delay cells of their corresponding auxiliary loops 430-450. At one input, enable cells 432, 442, and 452 receive the output of a previous delay cell. At the other input, enable cells 432, 442, and 452 receive an enable control signal En1, En2, and En(n), respectively. Accordingly, when its enable control signal En1, En2, or En(n) is high, each enable cell 432, 442, and 452 acts as a simple inverter and outputs an inverted version of the signal received from the previous delay cell. In contrast, when its enable control signal En1, En2, or En(n) is low, each enable cell 432, 442, and 452 acts as a signal barrier and outputs a logic low regardless of the signal received from the previous delay cell. This effectively stops any oscillations in, and deactivates, that particular ring loop 430, 440, or 450.

Using NAND gates has an advantage in that they are themselves inverting delay cells. Accordingly, a NAND gate can serve as both a delay cell and an enable cell, which can reduce any additional hardware costs. However, it will be appreciated that other elements capable of activating or deactivating a particular loop can be used according to various other embodiments of the invention, such as switches, transmission gates, AND gates, etc. Furthermore, although not illustrated, it will be appreciated that main loop 420 can also include an enable cell in the same manner as any of the auxiliary groups 430-450 where, for example, it may be advantageous to turn off ring oscillator 400 completely without turning off the power supply.

Figure 5:
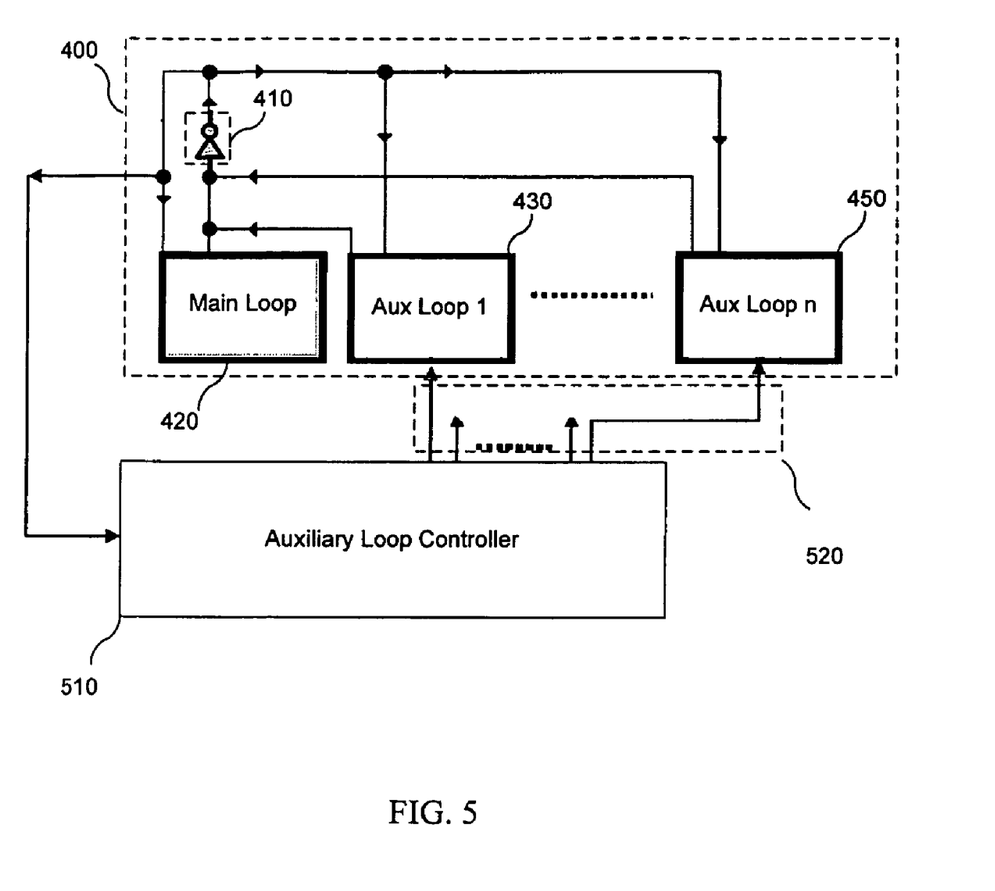
FIG. 5 illustrates an apparatus including the ring oscillator of FIG. 4 and an auxiliary loop controller.

FIG. 5 illustrates an apparatus including the ring oscillator of FIG. 4 and an auxiliary loop controller according to embodiments of the invention.

In certain applications, it may be desirable to dynamically control the activation or deactivation of each auxiliary loop. As described above, the number of auxiliary loops operating in conjunction with the main loop affects both performance (e.g., signal quality) and power consumption. Accordingly, FIG. 5 provides an auxiliary loop controller 510 configured to determine how many auxiliary loops 430-450 to activate based on a given criteria, and to dynamically assert or de-assert control signals 520.

As shown in FIG. 5, loop controller 510 also receives the output signal of ring oscillator 400 as an input. Accordingly, loop controller 510 can be configured to dynamically assert or de-assert control signals 520 as part of a feedback loop based on a measured jitter value of the output signal. For example, loop controller 510 can measure the jitter value of the output signal and compare it to a reference value. The reference value may be a predetermined jitter tolerance, for example, or may be dynamically provided by a system controller or the like (not shown). In one embodiment, loop controller 510 asserts one additional control signal if the measured jitter value is above the reference value and de-asserts one additional control signal if the measured jitter value is below the reference value. This design increases performance when needed and conserves power when possible. In other embodiments, more than one additional control signal is asserted or de-asserted based on the magnitude of the difference between the measured jitter value and the reference value obtained by the comparison.

Figure 6:
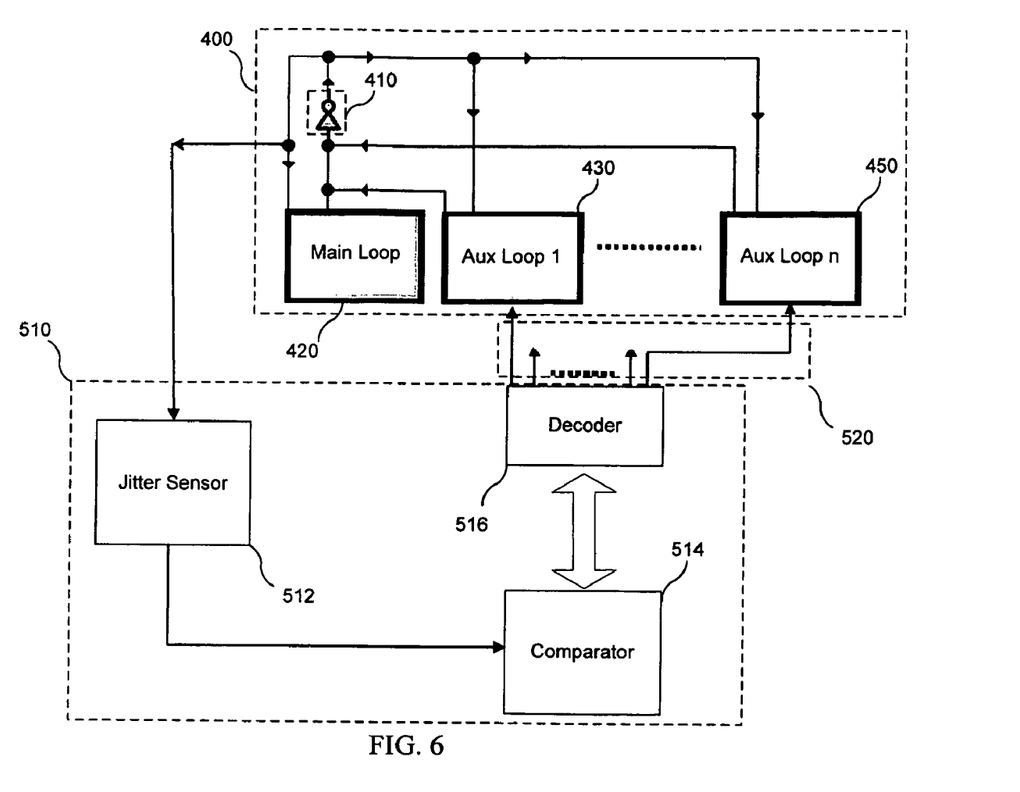
FIG. 6 illustrates an example design of the auxiliary loop controller of FIG. 5.

FIG. 6 illustrates an example design of the auxiliary loop controller of FIG. 5 according to an embodiment of the invention.

As shown, auxiliary loop controller 510 includes a jitter sensor 512, a comparator 514, and a decoder 516. Jitter sensor 512 receives the output signal of ring oscillator 400 and measures the jitter. Comparator 514 compares the measured jitter value to a reference value, and determines how many auxiliary loops 430-450 to activate in the next cycle of the feedback loop. Comparator 514 outputs a coded signal, such as a binary signal, to decoder 516 indicating the number of loops. Decoder 516 asserts or de-asserts the appropriate control signals 520 based on the received coded signal, and thereby activates or deactivates the appropriate number of auxiliary loops 430-450.

The auxiliary loop controller designs of FIGS. 5 and 6 operate dynamically under a feedback loop with the illustrated ring oscillator output. However, auxiliary loop controller 510 is also configurable to provide non-feedback based control schemes, which may be more desirable for certain applications. For example, auxiliary loop controller 510 may be configured to assert at least one control signal and no control signals in a 50% duty cycle. That is, auxiliary loop controller 510 can alternate between activating one or more of auxiliary loops 430-450 and deactivating them. This scheme provides some of the performance benefits described above while consuming less power. This may be desirable for battery powered applications where power consumption is a concern, such as laptops, cellular phones, etc. Further, the particular percentage duty cycle scheme can be adjusted to fit the performance versus power consumption requirements of the specific application.

Figure 7:
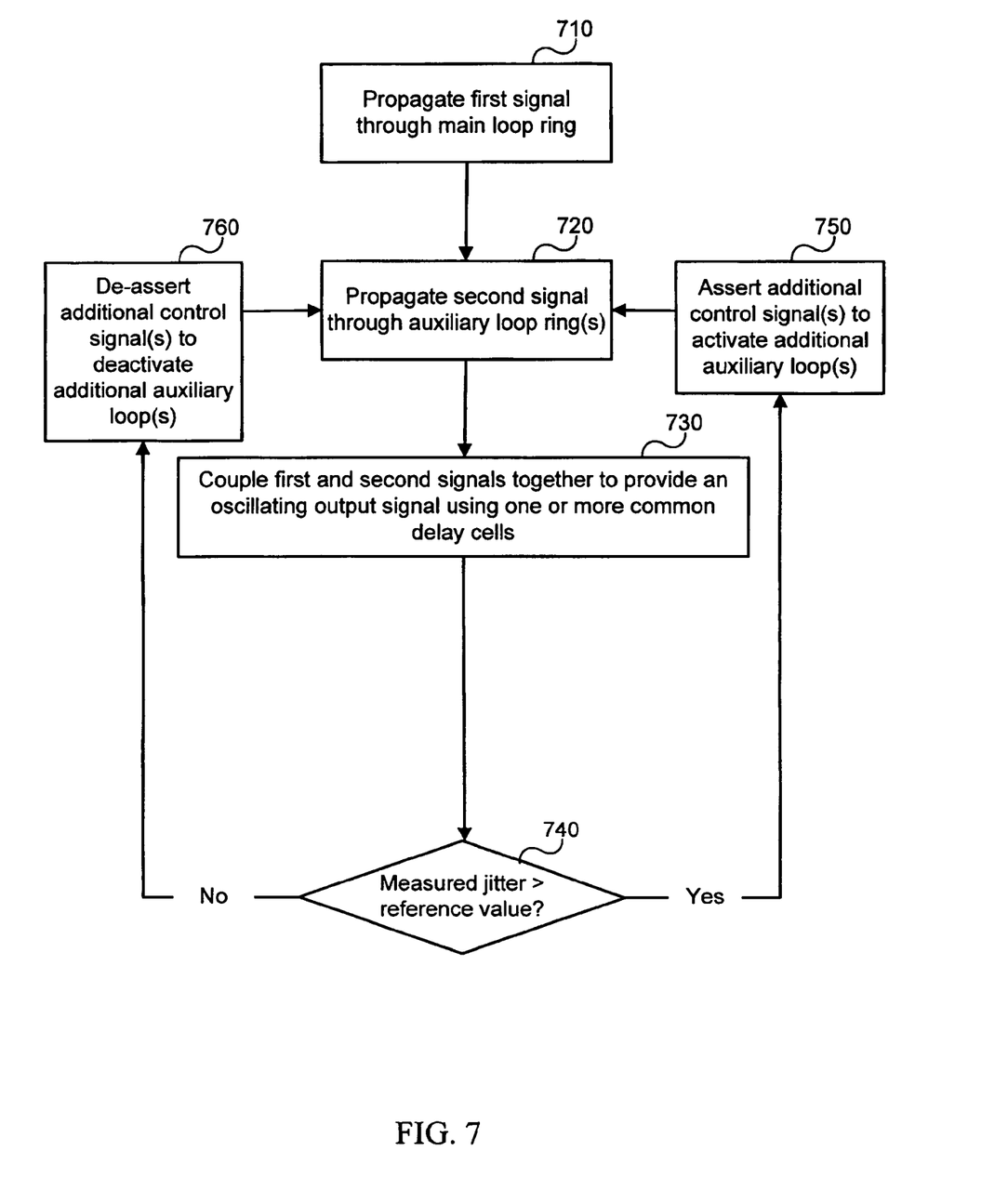
FIG. 7 illustrates a method of providing an oscillating signal using a ring oscillator.

FIG. 7 illustrates a method of providing an oscillating signal using a ring oscillator according to embodiments of the invention.

As shown, a first signal is propagated through a main ring loop (block 710). A second signal is propagated through at least one auxiliary loop. (block 720) As discussed above in more detail, the main ring loop and auxiliary loops are formed of a plurality of series coupled delay cells. For example, the main ring loop and auxiliary loops may be formed as illustrated in any of FIGS. 2-4. The first and second signals are coupled together to provide an oscillating output signal using one or more common delay cells shared between the main ring loop and the at least one auxiliary loop (block 730).

With reference back to FIG. 4, the auxiliary loops 430-450 can be independently controlled (i.e., activated or deactivated) using control signals En1 through En(n). The control signals can be dynamically asserted or de-asserted based on a measured jitter value of the ring oscillator output signal. According to one embodiment, the measured jitter value may be compared to a reference value (block 740). A given number of control signals may then be asserted if the measured jitter value is above the reference value (block 750), or de-asserted if the measured jitter value is below the reference value (block 760). The number of control signals to assert or de-assert depends on the desired control scheme, as discussed above with reference to FIG. 5. According to another embodiment, the number of control signals to assert or de-assert may be based on a desired percent duty cycle. For example, one or more control signals and no control signals can be alternately asserted in a 50% duty cycle.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for providing an oscillating signal. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising a ring oscillator and a loop controller, the ring oscillator comprising:
    a first ring loop comprising a plurality of series coupled delay cells; and
    at least one additional ring loop comprising a plurality of series coupled delay cells, the at least one additional ring loop being coupled to the first ring loop by one or more common delay cells shared between the first ring loop and the at least one additional ring loops, and an enable cell configured to activate or deactivate the additional ring loop based on a corresponding control signal,
    wherein the loop controller is configured to dynamically control the number of active additional ring loops by individually asserting or de-asserting each control signal, and
    wherein the first ring loop and the at least one additional ring loop are configured to be active concurrently when the at least one additional ring loop is activated, and the first ring loop is configured to be active independently of the at least one additional ring loop when the at least one additional ring loop is deactivated.

2. The apparatus of claim 1, wherein the delay cell is one of an inverter and a NAND gate.

3. The apparatus of claim 1, wherein the at least one additional ring loop and the first ring loop each comprise at least one delay cell that is not shared between them.

4. The apparatus of claim 1, wherein the at least one additional ring loop is coupled to the first ring loop by more than one common delay cell shared between the first ring loop and the at least one additional ring loops.

5. The apparatus of claim 1, wherein the enable cell is a NAND gate.

6. The apparatus of claim 1, wherein the loop controller is configured to dynamically assert or de-assert the control signals based on a measured jitter value of an output signal of the ring oscillator.

7. The apparatus of claim 6, wherein the loop controller compares the measured jitter value to a reference value, asserts at least one additional control signal if the measured jitter value is above the reference value, and de-asserts at least one additional control signal if the measured jitter value is below the reference value.

8. The apparatus of claim 6, wherein the loop controller comprises:
    a jitter sensor configured to measure the jitter value of the output signal of the ring oscillator;
    a comparator configured to compare the measured jitter value to a reference value, and to determine how many of the at least one additional loops to activate based on the comparison; and
    a decoder configured to assert or de-assert the control signals based on an output of the comparator.

9. The apparatus of claim 1, wherein the loop controller is configured to assert at least one control signal and no control signals in a 50% duty cycle.

10. The apparatus of claim 1, wherein the loop controller is configured to dynamically control the number of active additional ring loops independently from the first ring loop.

11. The apparatus of claim 10, wherein the loop controller is configured to de-assert at least one control signal while the first ring loop is active.

12. The apparatus of claim 1, wherein the ring oscillator comprises more than one of the additional ring loops, and wherein the loop controller is configured to activate an intermediate number of additional ring loops that is less than the total number of additional ring loops to operate in concert with the first ring loop by the individually asserting or de-asserting of each control signal.

13. The apparatus of claim 12, wherein the loop controller is further configured to change the number of active additional ring loops operating in concert with the first ring loop from a first number to a second number, the first and second numbers being different from each other.

14. The apparatus of claim 1, wherein each additional ring loop comprises at least one delay cell that is not shared with the first ring loop.

15. The apparatus of claim 1, wherein the first ring loop is configured to remain active when one or more additional ring loops is deactivated.

16. A method of providing an oscillating signal using a ring oscillator, the method comprising:
    propagating a first signal through a first plurality of series coupled delay cells forming a first ring loop of the ring oscillator;
    propagating a second signal through at least one additional plurality of series coupled delay cells forming at least one additional ring loop of the ring oscillator, each additional ring loop being individually activated or deactivated by a corresponding control signal, wherein the first signal and the second signal are propagated concurrently through each additional ring loop that is activated, and wherein the first signal is propagated independently of any additional ring loop being deactivated;
    coupling the first and second signals together to provide an oscillating output signal using one or more common delay cells shared between the first ring loop and the at least one additional ring loops; and
    dynamically controlling the number of active additional ring loops by individually asserting or de-asserting each control signal.

17. The method of claim 16, wherein the first and second signals are coupled together using more than one common delay cell shared between the first ring loop and the at least one additional ring loops.

18. The method of claim 16, further comprising dynamically asserting or de-asserting the control signals based on a measured jitter value of an output signal of the ring oscillator.

19. The method of claim 18, wherein dynamically asserting or de-asserting the control signals comprises:
    comparing the measured jitter value to a reference value;
    asserting at least one additional control signal if the measured jitter value is above the reference value; and de-asserting at least one additional control signal if the measured jitter value is below the reference value.

20. The method of claim 18, wherein dynamically asserting or de-asserting the control signals comprises:
    measuring the jitter value of the output signal of the ring oscillator;
    comparing the measured jitter value to a reference value;
    determining how many of the at least one additional loops to activate based on the comparison; and
    asserting or de-asserting the control signals based on an output of the comparator.

21. The method of claim 16, further comprising asserting at least one control signal and no control signals in a 50% duty cycle.

22. An apparatus comprising a ring oscillator and loop control means, the ring oscillator comprising:
    a first ring loop comprising a plurality of series coupled means for delaying and inverting an input; and
    at least one additional ring loop comprising a plurality of series coupled means for delaying and inverting an input, the at least one additional ring loop being coupled to the first ring loop by one or more common means for delaying and inverting an input shared between the first ring loop and the at least one additional ring loops, and means for activating or deactivating the additional ring loop based on a corresponding control signal,
    wherein the loop control means comprises means for dynamically controlling the number of active additional ring loops by individually asserting or de-asserting each control signal, and
    wherein the first ring loop and the at least one additional ring loop are configured to be active concurrently when the at least one additional ring loop is activated, and the first ring loop is configured to be active independently of the at least one additional ring loop when the at least one additional ring loop is deactivated.

23. The apparatus of claim 22, wherein the at least one additional ring loop is coupled to the first ring loop by more than one common means for delaying and inverting an input shared between the first ring loop and the at least one additional ring loops.

24. The apparatus of claim 22, wherein the means for dynamically asserting or de-asserting the control signals uses a measured jitter value of an output signal of the ring oscillator.

25. The apparatus of claim 24, wherein the means for dynamically asserting or de-asserting the control signals compares the measured jitter value to a reference value, asserts at least one additional control signal if the measured jitter value is above the reference value, and de-asserts at least one additional control signal if the measured jitter value is below the reference value.

26. The apparatus of claim 24, wherein the means for dynamically asserting or de-asserting the control signals comprises:
    means for measuring the jitter value of the output signal of the ring oscillator;
    means for comparing the measured jitter value to a reference value, and for determining how many of the at least one additional loops to activate based on the comparison; and
    means for asserting or de-asserting the control signals based on an output of the means for comparing.

27. The apparatus of claim 22, wherein the loop control means further comprises means for asserting at least one control signal and no control signals in a 50% duty cycle.

28. An apparatus comprising a ring oscillator and a loop controller, the ring oscillator comprising:
    a first ring loop comprising a plurality of series coupled delay cells; and
    at least one additional ring loop comprising a plurality of series coupled delay cells, the at least one additional ring loop being coupled to the first ring loop by one or more common delay cells shared between the first ring loop and the at least one additional ring loops, and an enable cell configured to activate or deactivate the additional ring loop based on a corresponding control signal,
    wherein the loop controller is configured to dynamically control the number of active additional ring loops by comparing a measured jitter value of an output signal of the ring oscillator to a reference value, asserting at least one additional control signal if the measured jitter value is above the reference value, and de-asserting at least one additional control signal if the measured jitter value is below the reference value.

29. The apparatus of claim 28, wherein the loop controller comprises:
    a jitter sensor configured to measure the jitter value of the output signal of the ring oscillator;
    a comparator configured to compare the measured jitter value to a reference value, and to determine how many of the at least one additional loops to activate based on the comparison; and
    a decoder configured to assert or de-assert the control signals based on an output of the comparator.

* * * * *